United States Patent
Gifford et al.

(10) Patent No.: US 7,623,139 B1
(45) Date of Patent: Nov. 24, 2009

(54) DESIGN AND MODELING SYSTEM AND METHODS

(75) Inventors: Ralph Gifford, South Lancaster, MA (US); Vincent Huffaker, Lafayette, CO (US); James Hurt, Milford, OH (US); Kurt Andersen, Nashua, NH (US)

(73) Assignee: Enventive Engineering, Inc., South Lancaster, MA (US)

( * ) Notice: Subject to any disclaimer, the term of this patent is extended or adjusted under 35 U.S.C. 154(b) by 523 days.

(21) Appl. No.: 10/959,896

(22) Filed: Oct. 6, 2004

Related U.S. Application Data

(60) Provisional application No. 60/509,388, filed on Oct. 7, 2003.

(51) Int. Cl.
*G09G 5/00* (2006.01)
*G09F 19/00* (2006.01)

(52) U.S. Cl. .................... 345/619; 700/97; 700/100; 700/103; 700/104; 700/105; 700/108; 700/110

(58) Field of Classification Search ............... 345/619; 700/97, 100, 103, 104, 105, 108, 110
See application file for complete search history.

(56) References Cited

U.S. PATENT DOCUMENTS

| | | | | |
|---|---|---|---|---|
| 5,617,510 A | * | 4/1997 | Keyrouz et al. | 706/45 |
| 5,831,875 A | * | 11/1998 | Hirata et al. | 703/7 |
| 5,867,397 A | * | 2/1999 | Koza et al. | 703/14 |
| 6,333,749 B1 | * | 12/2001 | Reinhardt et al. | 345/629 |
| 6,377,263 B1 | * | 4/2002 | Falacara et al. | 345/473 |
| 6,433,776 B1 | * | 8/2002 | Todd | 345/157 |
| 6,889,113 B2 | * | 5/2005 | Tasker et al. | 700/180 |
| 6,947,037 B1 | * | 9/2005 | Lynn et al. | 345/419 |
| 7,233,341 B1 | * | 6/2007 | Sauerbrei | 345/672 |
| 2003/0149498 A1 | * | 8/2003 | Rebello et al. | 700/97 |
| 2003/0149502 A1 | * | 8/2003 | Rebello et al. | 700/98 |
| 2003/0182311 A1 | * | 9/2003 | Nakajima et al. | 707/104.1 |
| 2003/0187879 A1 | * | 10/2003 | Tamaru et al. | 707/104.1 |
| 2004/0090439 A1 | * | 5/2004 | Dillner | 345/440 |
| 2005/0071042 A1 | * | 3/2005 | Subrahmanyam et al. | 700/212 |

OTHER PUBLICATIONS

Alvarado, "A Natural Sketching Environment: Brining the Computer into Early States of Mechanical Design", MIT, May 2000, pp. 1-104.*

* cited by examiner

*Primary Examiner*—Ulka Chauhan
*Assistant Examiner*—Jeffrey J Chow
(74) *Attorney, Agent, or Firm*—Hamilton, Brook, Smith & Reynolds, P.C.

(57) ABSTRACT

A computer added design system enables layout of a dependent component based on master components having a set of geometric and functional properties. Based on the state of the dependent component imposed by the assembly, as well as user-entered parameters, modification to the set of properties can be calculated. Based on the calculated modification, the master component and dependent component are updated.

13 Claims, 16 Drawing Sheets

Geometric and mathematical constraints solved variationally within one process. Looping not required to solve interdependencies.

FIG. 4

Method (500):

Accept User Input To Create A Master Component (502)

Solve User-Entered Equations To Compute Functional Properties Of Modeled Components Based On Geometric Properties and Non-Geometric Parameters (504)

Constrain Geometric Properties Or Values By Defined Functional Relationships: Maintain Constraint Relationship Directly Between Each Geometric Property/Value In Original Component And Corresponding Property/Value In Copy (506)

FIG. 5A

DESIGN AND MODELING SYSTEM AND METHODS

CROSS-REFERENCE TO RELATED PATENT APPLICATION

The present application for United States Patent claims the priority of related, commonly owned Provisional Application for U.S. Patent Ser. No. 60/509,388 filed Oct. 7, 2003 entitled "Design and Modeling System and Methods."

FIELD OF THE INVENTION

The present invention relates to computer-aided design (CAD) and associated methods and systems for designing, modeling and simulating objects, components and assemblies of components.

GLOSSARY OF TERMS USED IN THIS DOCUMENT

Constraint Server (CS)—A CS is computer software code used to solve and maintain mathematical and/or geometric relationships (e.g., y constrained equal to 2 times x, lines constrained to be parallel or perpendicular, a line constrained tangent to a circle).

MACS—The CS used in a prior art system known as Mechanical Advantage (MA), commercially available from Cognition Corporation of Bedford, Mass.

ECS—A CS in accordance with the present invention.

Parametric—Refers to a method of solving mathematical and/or geometric relationships that essentially requires that the relationships be sequential (directed), and processes them accordingly. For example, if y=2x, and x=3z, a parametric system would need to begin with the value of z to solve x, and then solve for y based on the value of x. A spreadsheet is fundamentally parametric, requiring a certain sequence in the order in which cells are solved.

Variational—Refers to a method of solving non-directed relationships. For example, a variational system could solve for x in the relationship $2x+5=3x^2-2$. In this case, x on the left side of the equation depends on x on right side of the equation, and vice versa. Or if the equation were written as $2x+b=ax^2-c$, and sufficient other relationships were defined in terms of a, b, c, and x, thereby creating a system of interdependent equations, a variational system would be able to solve the system of equations (assuming a solution exists). The ECS is variational.

BACKGROUND OF THE INVENTION

As a general matter, CAD systems require a constraint server for geometric modeling purposes. Most CAD constraint servers are specialized for geometric modeling purposes and do not handle general mathematical relationships. In addition, most conventional CAD CS's are parametric with some limited variational capabilities. Several geometric problems are not easily solved with parametric methods, so designers and users of conventional constraint servers attempt to adapt them to solve these modeling problems on a special-case basis.

The special cases employ methods that are somewhat variational, but not in a broad sense of the term. Instead, the adapted functionality is somewhat analogous to the goal seeking capability of a spreadsheet. A spreadsheet is basically parametric, but with a limited ability to solve systems of equations through the use of goal seeking methods.

It would be useful to provide a system utilizing true variational methods to enable enhanced handling and solving of geometric and other problems in CAD and other design and modeling systems.

It would also be useful to provide a system that can handle general mathematical as well as geometric constraints in an integrated manner.

In addition, it would be useful to provide a system that combines mathematical and geometric modeling in a manner that eliminates performance and convergence problems, and simplifies customer modeling.

Still further, it would be useful to provide a system that supports flexible dependent instances (non-rigid bodies) with inherent functional properties, thus providing users with the ability to model devices that move and/or respond in some manner when assembled as dependent instances with other simulated parts.

SUMMARY OF THE INVENTION

One aspect of the present invention is a variational constraint server for computer-based design and modeling systems. The variational constraint server supports combined mathematical and geometric modeling, and is operable to (1) accept user input to create a master component, and (2) solve user-entered equations to compute functional properties of modeled components based on geometric properties and non-geometric parameters, or (3) to constrain geometric properties or values by user-defined functional relationships.

Another aspect of the present invention includes methods for providing a variational constraint server having the above-referenced functions and properties.

Other aspects of the present invention, and examples of its functions and implementations, will be described in detail in connection with the attached drawings.

BRIEF DESCRIPTION OF THE DRAWINGS

Aspects, embodiments and examples of the present invention will next be discussed in connection with the attached drawings, in which:

FIG. 4 is a block diagram depicting the combination of mathematical and geometric modeling characteristic of the present invention.

FIG. 5A is a flowchart showing overall method steps of the present invention.

DESCRIPTION OF THE INVENTION

The following detailed description is organized into the following sections:

I. Overview
II. Combining Geometric and Mathematical Relationships
III. Aspects of Handling Dependent Components
IV. Aspects of Handling Flexible Dependent Components
V. Assembly Constraints
VI. Conclusion

I. Overview

Preface:

The following discussion describes methods, structures and systems in accordance with the present invention. It will be understood by those skilled in the art that the described methods and systems can be implemented in software, hardware, or a combination of software and hardware, using conventional computer apparatus such as a personal computer (PC) or equivalent device operating in accordance with (or emulating) a conventional operating system such as Microsoft Windows, Linux, or Unix, either in a standalone configuration or across a network. The various processing means and computational means described below and recited in the claims may therefore be implemented in the software and/or hardware elements of a properly configured digital processing device or network of devices.

Figure 1:
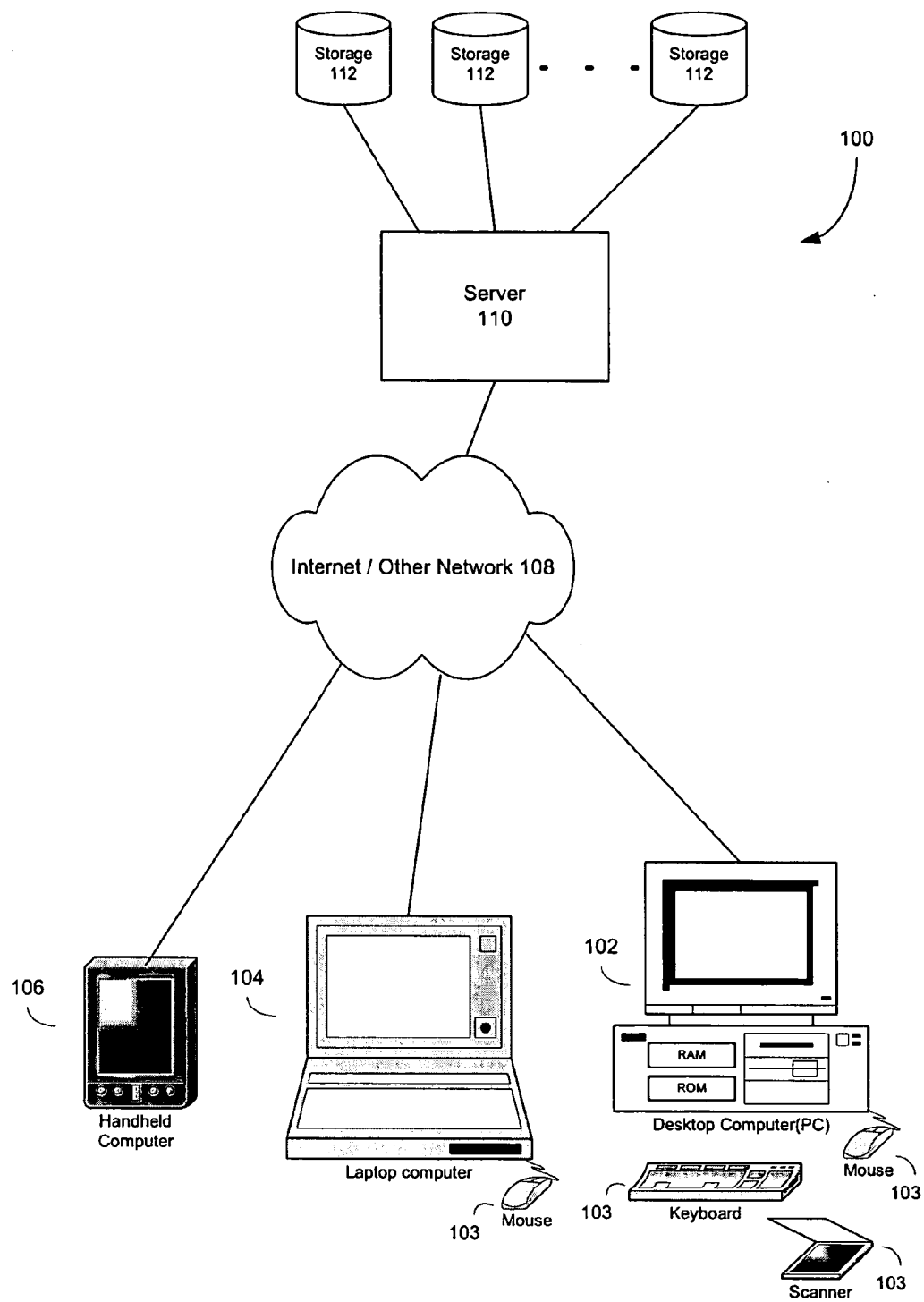
FIG. 1 is a schematic diagram of a prior art computer-based network in which the present invention may be embodied or implemented.

Methods, devices or software products in accordance with the invention can operate on any of a wide range of conventional computing devices and systems, like those depicted by way of example in FIG. 1 (e.g., network system 100), whether standalone, networked, portable or fixed, including conventional PCs 102, laptops 104, handheld or mobile computers 106, or across the Internet or other networks 108, which may in turn include servers 110 and storage 112.

Figure 2:
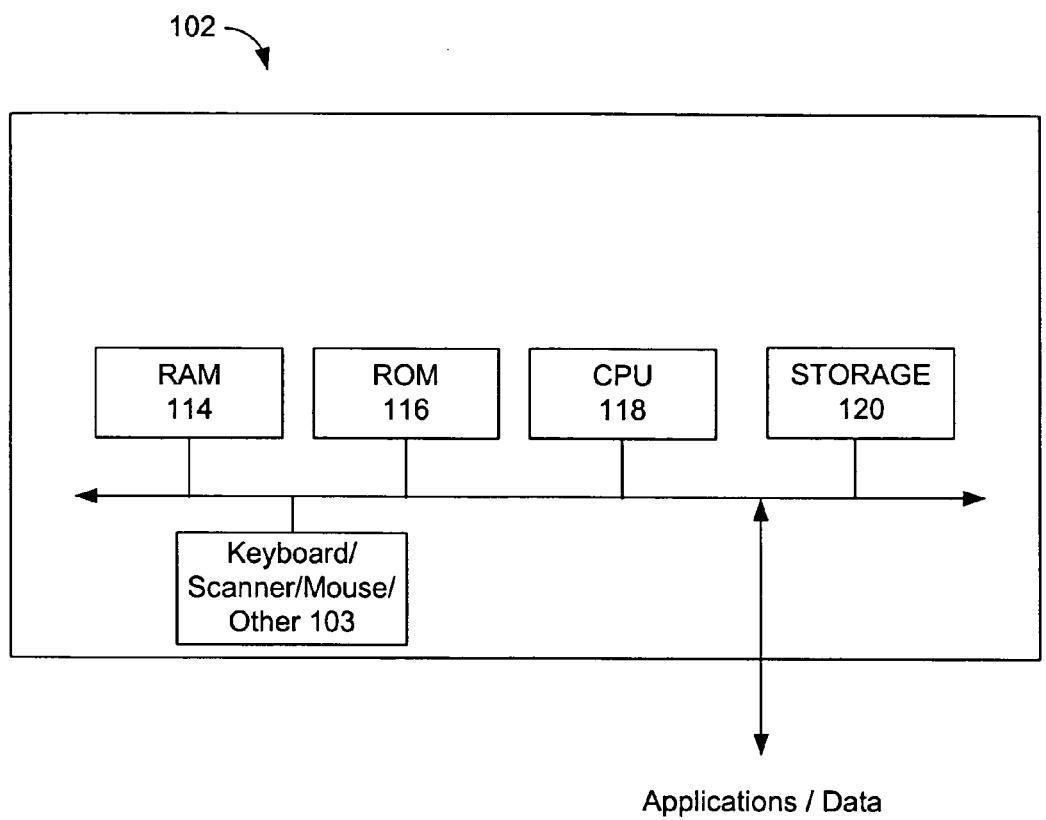
FIG. 2 is a schematic diagram of a prior art personal computer (PC), workstation or other processing device like those shown in FIG. 1, in which the present invention may be embodied or implemented.

In line with conventional computer software and hardware practice, a software application configured in accordance with the invention can operate within, e.g., a PC 102 like that shown in FIG. 2, in which program instructions can be read from CD ROM 116, magnetic disk or other storage 120 and loaded into RAM 114 for execution by CPU 118. Data can be input into the system via any known device or means, including a conventional keyboard, scanner, mouse or other elements 103.

Functional Overview:

The ECS of the present invention differs from conventional CAD constraint servers because the ECS handles general mathematical relationships (equations) as well as geometric constraints. In one practice of the invention, the ECS converts geometric constraints into mathematical constraints so that all constraints can be handled mathematically.

Fundamental differences between the present invention and prior art systems such as Mechanical Advantage include the following:

The manner in which they combine geometric and mathematical relationships.
Their handling of dependent components.
The combined effect of the preceding differences.

These differences will next be discussed in detail.

II. Combining Geometric and Mathematical Relationships

One primary prior art product, Mechanical Advantage, separated geometric modeling and mathematical modeling into two separate applications. These applications literally ran as different computer processes. These processes could share certain data with each other via the networking layer.

Figure 3:
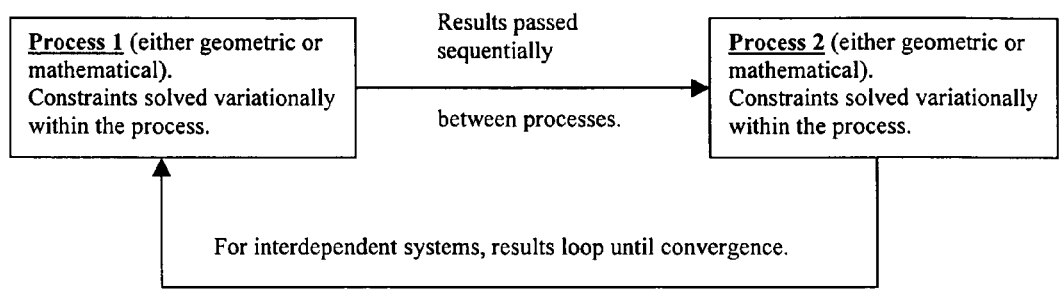
FIG. 3 is a block diagram depicting the separation of mathematical and geometric modeling typical of the prior art.

Because the geometric and mathematical modeling applications in the Mechanical Advantage product ran in two separate processes, the constraints in each process were solved separately. In the Mechanical Advantage product, for example, in order to solve a combination of geometric and mathematic constraints, the product essentially combined parametric and variational methods, coupled with goal seeking methods. In other words, the constraints of one process would be solved variationally, and the results would then be sequentially (parametrically) passed to the next process, which would proceed to solve its constraints variationally. In cases involving interdependencies between the processes, goal seeking methods were used to iterate until the solutions converged. See FIG. 3 as an illustration of the process.

In contrast, in a system according to the present invention, geometric and mathematical modeling is combined into a common process so that all of the constraints are solved variationally. Essentially this eliminates parametric looping. This combination, enabled by a system according to the present invention, looks like FIG. 4.

The ability to directly combine geometric and mathematical constraints enables a user of the present invention to "build" (or model or simulate) components with constraints that will compute functional properties (e.g., load capacities, stress levels, voltage rise, current draw, and others). Models constructed using the present invention are more powerful, more flexible, and eliminate the convergence problems associated with conventional systems such as Mechanical Advantage.

As will next be discussed in the following sections, the overall method in accordance with one practice of the present invention, as shown in FIG. 5A, includes accepting user input to create a master component (502), solving user-entered equations to compute functional properties of modeled components based on geometric properties and non-geometric parameters (504), and constraining geometric properties or values by defined functional relationships, wherein the constraining aspect includes maintaining a constraint relationship directly between each geometric property or value in the original component and the corresponding property or value in the copy (506).

Figure 5B:
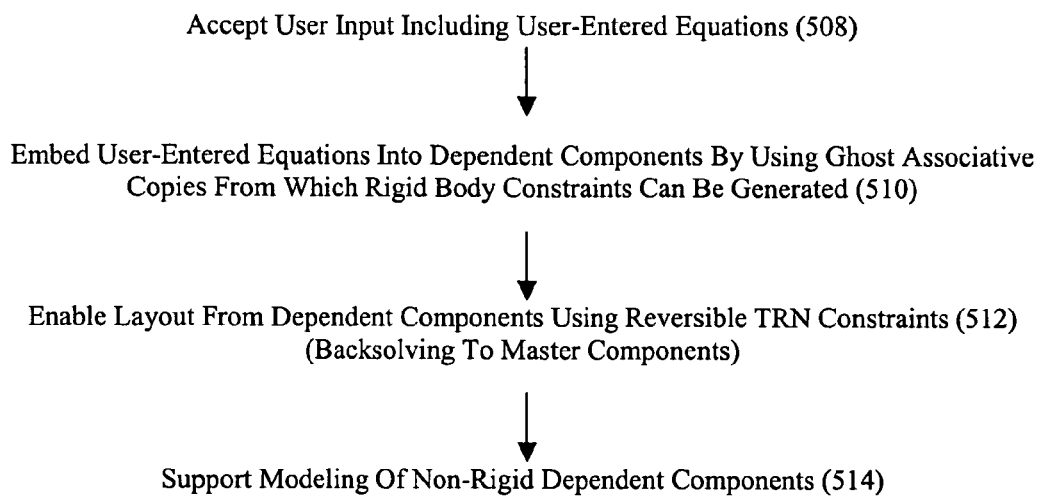
FIG. 5B is a flowchart depicting other aspects of the present invention.

Further aspects of the invention, discussed in greater detail below, are illustrated in the flowchart of FIG. 5B. As shown therein, method aspects according to the invention further include accepting user input including user-entered equations (508), embedding the user-entered equations into dependent components by using ghost associative copies from which rigid body constraints can be generated (510), wherein each dependent copy has a corresponding master copy that can be used to modify geometric values, for backsolving and for layout, while appearing to a user to be a rigid body, enabling layout from dependent components by using reversible TRN constraints and thereby backsolving to master components (512), to support modeling of non-rigid dependent components (514).

III. Aspects of Handling of Dependent Components

As is typical of many conventional CAD systems, the prior art Mechanical Advantage system supports the notion of master components and dependent components. In the Mechanical Advantage system, dependent components are instances of the master components, and are treated as rigid bodies. Changes to the master component are propagated to the dependent components.

In the Mechanical Advantage system, dependent components can be rotated or moved as rigid bodies, and other objects (e.g., lines, arcs, circles) may be constrained to individual elements within a dependent component, but the individual elements within a dependent component may not themselves be edited (changed). Changes to an individual element must be made to the master component, and are then propagated to all of its dependent components.

A prior art method for executing this function—as well as methods in accordance with the present invention—are set forth in Section V entitled Assembly Constraints discussed below.

Prior Art for Handling of Dependent Components:

The essence of the prior art method is that the position and orientation of all individual elements in a specific dependent component are computed by a transformation matrix that rigidly maintains the relative position of each element with respect to the others. In other words, the relationship between the individual elements in a dependent component are not maintained by constraints between those elements, but by position and orientation information computed from the constraints in the master component, and the position and orientation of the group of elements (dependent copy) is computed by the transformation matrix. The prior art method, typical of the Mechanical Advantage product, provides some "directedness" in the CS constraint graph that improves computational performance and improves model "manageability" for users. However, a significant disadvantage is that the directedness limits flexibility and precludes the ability to use dependent components in conjunction with an important engineering function known as "layout," or sometimes referred to as "backsolving."

The Present Invention

Backsolving: Backsolving is an important advantage that is provided by using the variational system and method of the invention. The prior art methods of managing components severely restricts variational capabilities in this area.

Handling Flexible Dependent Components: The present invention's handling of dependent components departs significantly from that of prior art systems such as Mechanical Advantage. In the present invention, dependent components may differ from the master component, and even from other dependent components associated with the same master component. In essence, a system constructed in accordance with the invention maintains component topology but permits different values for variables associated with each instance of a component. By topology, we mean the rules (constraints) that govern the behavior of an object, or collection of objects.

For example, if a master component consists of a fully constrained rectangle, the rectangle will likely have 4 coincident point constraints (one at each corner), and 3 orientation constraints (some combination of parallel and perpendicular constraints) such that each side of the rectangle would stay properly oriented to the other sides. The coincident point and orientation constraints will govern the topology of the master component, giving it its box-like shape.

In accordance with one practice of the present invention, each dependent component can have a different height and width than the master component, and still be a rectangle. The topology is maintained, but the size of each dependent rectangle is different. A user is unable to change the topology (i.e., change the constraint scheme) of a dependent component, but is able to change designated values.

A number of different methods can be used to enable this functionality in accordance with the present invention, some of which will next be discussed by way of example. Those skilled in the art will appreciate that variations of these methods can also be employed, within the spirit and scope of the present invention.

Method 1—Scalar Parameters

This method is described in greater detail in Section V below entitled Assembly Constraints. The essence of the method is that the transformation matrices generated by the Master component would include the ability to scale certain elements within the matrix.

With this method, dependent components are still effectively rigid bodies, but with the important advantage that they can be different size rigid bodies. However, this method does not support layout or backsolving.

Method 2—Hidden Topology Constraints

This method presents significant technical advantages over prior art systems such as the Mechanical Advantage product. This method essentially duplicates the topology constraints from the master component into the dependent component, but keeps them hidden from the user so that the user is unable to edit or change them.

This method permits layout and backsolving, and would support notions such as springs and other flexible elements. The basis of the method essentially amounts to copying elements and constraints, and maintaining more sophisticated "bookkeeping" in order to maintain associativity between masters and components.

Method 3—A Hybrid Approach

This method, and its possible variations, essentially involves using ghost associative copies (essentially Method 2) from which rigid body constraints can be generated. In essence, each dependent copy has its own master copy which can be used to change sizes, and also used for backsolving and layout, but which appears to the user to be a rigid body in terms of model manageability.

Method 4—Lazy Evaluation/Master Function

This method essentially treats the master component as a subroutine or function that can be called on as necessary (lazy evaluation) to generate a new transformation matrix based on new values or requirements. This method has all the advantages of both the rigid body approach and the hidden constraint approach, without potential disadvantages of either approach.

IV. Aspects of Handling Flexible Dependent Components

Embedding User-Entered Equations into Dependent Components

Although some prior art systems have alluded to the notion of combining math and geometry aspects, they did not combine math and geometry in master components, with associative dependent components delivering functional properties defined in the master components. Put another way, while CAD companies and the like have delivered rigid body dependent components, and numerous math software tools and computer software languages support user-developed functions and subroutines based on math and logic equations and relationships, to date there has been no synergistic integration of these functions, tools and components as described herein.

The core of this integrative ability in the present invention is the ECS—a variational CS that supports combined math and geometric modeling. A user creating a master component can enter equations that compute functional properties based on geometric properties or parameters, and vice-versa (meaning that geometric properties or values may be constrained by functional relationships).

Among the methods for incorporating this functionality into dependent components, and particularly, flexible dependent components, are the following:

Method 1—Scalar Parameters Inflexible Dependent Components

Unlike geometry models, equations used to define functional capabilities need not take cognizance about transforming (rotating or moving) elements of a body. Setting aside the properties associated with using the component in an assembly, the functional equations pertaining to the component itself are (generally) independent of position and rotation. Therefore each variable in the equations is a candidate for being a scaleable parameter.

The transformation matrix for the equations is unity. In other words, the equations are essentially their own transformation matrix. In this regard, the scalar parameter approach essentially copies the equations from the master component into the transformation matrix of the dependent component, but prevents the user from changing the equations. The user may only change the value of the parameters within the equations. In this regard, this method combines the Scalar Parameter approach with the Hidden Constraints approach.

Method 2—Lazy Evaluation/Master Function in Handling Flexible Dependent Components This method follows the same "trajectory" of the lazy evaluation method described above. In particular, the notion of function calls to math equations is an already-solved problem. By extending this notion to deal with geometric modeling issues, and incorporating these notions into the ECS, the present invention achieves the ability to integrate advanced math and geometry functionality into flexible dependent components.

Additional aspects, practices and embodiments of the present invention will next be described in the following Section V (Assembly Constraints), which describes additional modeling and design techniques in accordance with the present invention

V. Assembly Constraints

1: Introduction

The following discussion provides background relating first to conventional modeling techniques, and then, to novel techniques in accordance with the invention.

An assembly is a collection of two or more parts that function in concert with each other. For this type of modeling, each of the parts that compose an assembly is either a simple rigid part or a sub-assembly composed of its own parts. In addition, certain deformations of parts are allowed to occur, such as the compression of a spring.

2: The User Interface

This section will describe the process of the user making copies of a part to use in an assembly, and how constraints on these parts will be handled.

2.1: Step 1

In accordance with known modeling techniques, the user will create geometry, then will select some of it and indicate that the selected geometry is a part. The graphics system, which operates in accordance with known computer graphic principles, will display a copy of the selected geometry but with a different transform applied. A particularly useful method is for the system to automatically select and apply the appropriate transform constraint based on other model information provided by the user. The user need not be aware of the different types of transform constraints, or the subtleties thereof. The user can then drag the displayed copy to a desired location.

Figure 6:
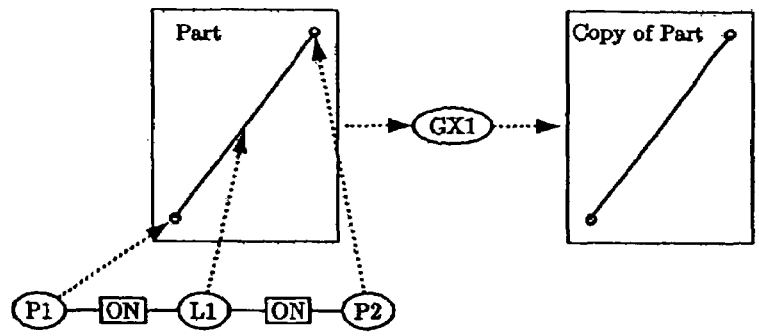
FIG. 6 is a schematic diagram depicting an example of a sample assembly of conceptual data in a user interface.

At this point, the conceptual data is illustrated in FIG. 6. FIG. 6 displays only one line with its two end points. However, many geometries can be selected and made into a part. The part could be, for example, a spring, and L1 could represent one segment of a spring.

The top half of FIG. 6 shows the graphics system view of the model, and the bottom half shows the CS's view of this same model. The CS solves for its parameters (e.g., P1, L1, and P2) and gives this solution to the graphics system, which displays the part. The three dotted arrows from the CS parameters to the graphics system objects in the part illustrate this flow of data.

GX1 is a graphics system transform which is used to make a copy of this part and display it. The two horizontal dotted arrows show this data flow. At this time, there is no communication between the CS and the graphics system for either the parameter GX1 or for the copy of the part.

2.2: Step 2

The user applies a constraint to a component of the copy of the part in FIG. 6, for example, to a copy of the point P1. The graphics system recognizes that this is a copy, and tells the CS to connect that component with a transform constraint. The initial value for this transform is given by the graphics transform GX1.

Figure 7:
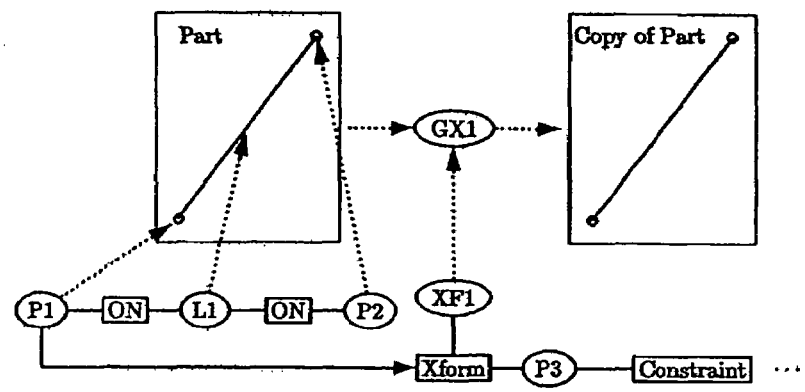
FIG. 7 is a schematic diagram depicting a further step in processing the assembly of conceptual data.

At this point in the process, the conceptual data will look like that in FIG. 7. The flow of information is from the CS parameters P1, L1, P2, and XF1 to their equivalent graphics system parameters, as shown by the vertical dotted arrows. The graphics transform GX1 gets its value from the CS transform XF1, as indicated by the dotted arrow. Other aspects constrained by the user are indicated by the three dots to the right of the constraint node.

The CS information in the parameter P3 could be used to determine where to draw the equivalent point in the graphics system, but that would be redundant. This position is already determined by the position of the point in the original part and by the transforms.

2.3: Following Steps

Any time the user tries to create a constraint using geometry from a copy of a part, the graphics system will check for the existence of that entity in the CS. If that entity does not exist in the CS, the graphics system will ask the CS to create it, using an existing CS transform if available or create a new CS transform as needed. The display of the copy of the part will use the graphics system transform, but that transform will now get its values from the CS.

3: Rigid Body Coordinate Transforms

The following discussion of prior art modeling techniques is set forth by way of background.

In two-dimensions, a rigid body coordinate transform consists of a translation and a rotation, and has three degrees of freedom. If the first two degrees of freedom is the translation and the third is the angle of rotation, then the components of an transform parameter are:

1. $T_0$=the x-component of the translation (units of length)
2. $T_1$=the y-component of the translation (units of length)
3. $T_2$=the angle of rotation (units are radians)

and the rigid body transformation of a point P1 with components $[P1_0, P1_1]$ into the point P2 with components $[P2_0, P2_1]$ is:

$$P2_0 = T_0 + \cos(T_2) \cdot P1_0 - \sin(T_2) \cdot P1_1$$

$$P2_1 = T_1 + \sin(T_2) \cdot P1_0 + \cos(T_2) \cdot P1_1 \quad (1)$$

Since Equation 1 is the formula for mapping all input points PI into their corresponding output points P2, the formula for transforming other types of geometry such as lines, circles, and Nonuniform Rational B-Splines ("NURBS") can be derived from this formula.

The equivalent graphics system transform is the four by four matrix:

$$GX = \begin{bmatrix} \cos(T_2) & -\sin(T_2) & 0 & T_0 \\ \sin(T_2) & \cos(T_2) & 0 & T_1 \\ 0 & 0 & 1 & 0 \\ 0 & 0 & 0 & 1 \end{bmatrix} \quad (2)$$

If the explicit value for the angle is not critical, then it could be said that each transform has four components:

1. $T_0$=the x-component of the translation (units of length)
2. $T_1$=the y-component of the translation (units of length)
3. $T_2$=the cosine of the angle of rotation
4. $T_3$=the sine of the angle of rotation and the one side equation:

$$\sqrt{T_2^2 + T_3^2} = 1 \quad (3)$$

and the rigid body transformation of a point P1 with components $[P1_0, P1_1]$ into the point P2 with components $[P2_0, P2_1]$ is:

$$P2_0 = T_0 + T_2 \cdot P1_0 - T_3 \cdot P1_1$$

$$P2_1 = T_1 + T_3 \cdot P1_0 + T_2 \cdot P1_1 \quad (4)$$

The equivalent graphics system transform is the four by four matrix:

$$GX = \begin{bmatrix} T_2 & -T_3 & 0 & T_0 \\ T_3 & T_2 & 0 & T_1 \\ 0 & 0 & 1 & 0 \\ 0 & 0 & 0 & 1 \end{bmatrix} \quad (5)$$

If the Quaternion representation due to Hamilton is used, it could be said that each transform has four components:

1. $T_0$=the x-component of the translation (units of length)
2. $T_1$=the y-component of the translation (units of length)
3. $T_2$=the cosine of half the angle of rotation
4. $T_3$=the sine of half the angle of rotation and the one side equation:

$$\sqrt{T_2^2 + T_3^2} = 1 \quad (6)$$

and the rigid body transformation of a point P1 with components $[P1_0, P1_1]$ into the point P2 with components $[P2_0, P2_1]$ is:

$$P2_0 = T_0 + (1 - T_2^2) \cdot P1_0 - 2T_2T_3 \cdot P1_1$$

$$P2_1 = T_1 + 2T_2T_3 \cdot P1_0 + (1 - T_2^2) \cdot P1_1 \quad (7)$$

The equivalent graphics system transform is the four by four matrix:

$$GX = \begin{bmatrix} 1 - T_2^2 & -2T_2T_3 & 0 & T_0 \\ 2T_2T_3 & 1 - T_2^2 & 0 & T_1 \\ 0 & 0 & 1 & 0 \\ 0 & 0 & 0 & 1 \end{bmatrix} \quad (8)$$

The side equation (6) could be eliminated by:

$$P2_0 = T_0 + P1_0 - \frac{T_2^2}{T_2^2 + T_3^2} \cdot P1_0 - \frac{2T_2T_3}{T_2^2 + T_3^2} \cdot P1_1 \quad (9)$$

$$P2_1 = T_1 + P1_1 - \frac{2T_2T_3}{T_2^2 + T_3^2} \cdot P1_0 - \frac{T_2^2}{T_2^2 + T_3^2} \cdot P1_1$$

4: Other Coordinate Transforms

The following discussion of prior art modeling techniques is set forth by way of background.

The above transforms are all rigid body transforms in that the distance between any two points remains unchanged after applying the transform. Not all transforms are rigid body transforms. The following transforms are given in their simplest forms, and are to be composited with a rigid body transform in real use.

A scaling transform has one parameter s, and transforms points by:

$$P2_0 = s \cdot P1_0$$

$$P2_1 = s \cdot P1_1 \quad (10)$$

Notice that the scale factor s is applied to both components of the point.

A stretching transform has one parameter s, and transforms points by:

$$P2_0 = s \cdot P1_0$$

$$P2_1 = P1_1 \quad (11)$$

Notice that the scale factor s is applied to only one component of the point. This constraint can be used to model the compression of a spring.

5: A Simple Assembly

Figure 8:
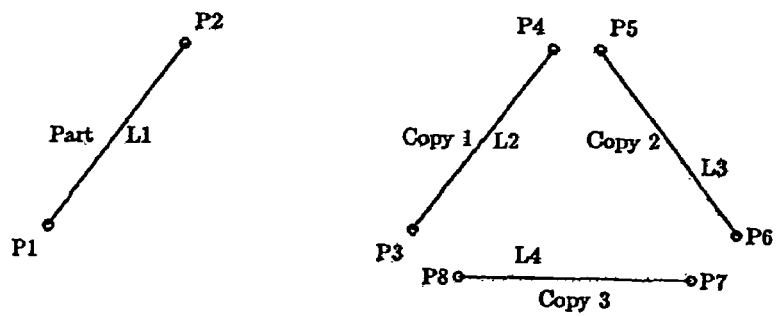
FIG. 8 is schematic diagram depicting another aspect of processing an assembly.

To illustrate the dependency graphs, a very simple assembly will be used as the example. This assembly is shown in FIG. 8, where the line L1 and its end points are the geometry of the one part, and lines L2, L3, and L4 and their end points are rigid body copies of the part consisting of line L1. Each of the copies has a different rigid body transform.

The intended assembly is to form an equilateral triangle by adding coincident point constraints between the point pairs P3 and P8, P4 and P5, and P6 and P7.

We next describe, by way of background, conventional techniques for handling such an assembly.

6: PACK and UNPACK

First, we provide a description of how this assembly would be handled in the conventional system known as Mechanical Advantage.

6.1: User Creates a Gateway

Figure 9:
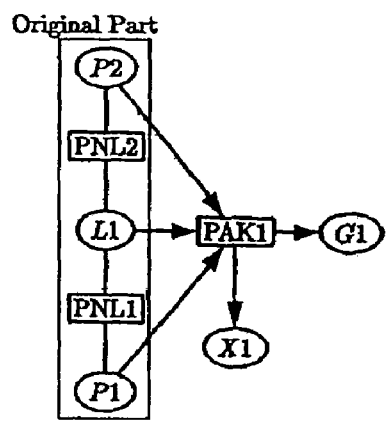
FIG. 9 is an example of a dependency graph that may be created using a conventional modeling system (PACK).

First, the user selects all the geometry for a part, in this case the line L1 and the two points P1 and P2, and indicates that these are to be grouped into a part. This creates the dependency graph as shown in FIG. 9. The arcs in the graph that connect to the newly created PACK constraint are permanently directed as indicated in this graph.

The gateway parameter G1 contains the concatenation of all the component values from all the input parameters as modified by the rigid body transform stored in the parameter X1. This gateway parameter is never displayed to the user, but it does appear in the Constraint Server's dependency graph.

When the input parameters have been changed, the solve method of the PACK constraint will get called after the last of these input parameters has been changed. This solve method will factor out a net rigid body motion from the collective changes to the input parameters, storing that transform in the parameter X1. The solve method will then apply that transform to each of the input parameters to produce the output parameter G1. This processing of the input parameters and the rigid body transform is done so that, if the changes to the input parameters were only a rigid body transform, then there would be no change to the collective parameter G1, affecting the propagation of changes to the constraints downstream of the parameter G1. There should never be constraints downstream of the rigid body transform in the parameter X1.

6.2: User Makes Copies of this Part

For each copy of this part, a rigid transform parameter is added as well as a parallel parameter and a UNPACK constraint for each input parameter to the PACK constraint. For one copy of the part, the dependency graph looks like that in FIG. 10. The arrows in this dependency graph denote arcs that are permanently directed when this series of PACK and UNPACK constraints are created.

Notice that there are no point-on-line constraints between the line L2 and the points P3 and P4. If the data is followed for the parameter P1, it undergoes a rigid body transform as it is copied into the parameter G1, then undergoes another rigid body transform as it is copied into the parameter P3. The same process happens to the data in the parameters L1 (ending up in the parameter L2) and P2 (ending up in the parameter P4). Thus, the point-on-line constraint PNL1 between P1 and L1 will keep the point P3 on the line L2 as well as keeping the point P1 on the line L1, and the same holds for all the constraints on the original geometry of this part.

Figure 11:
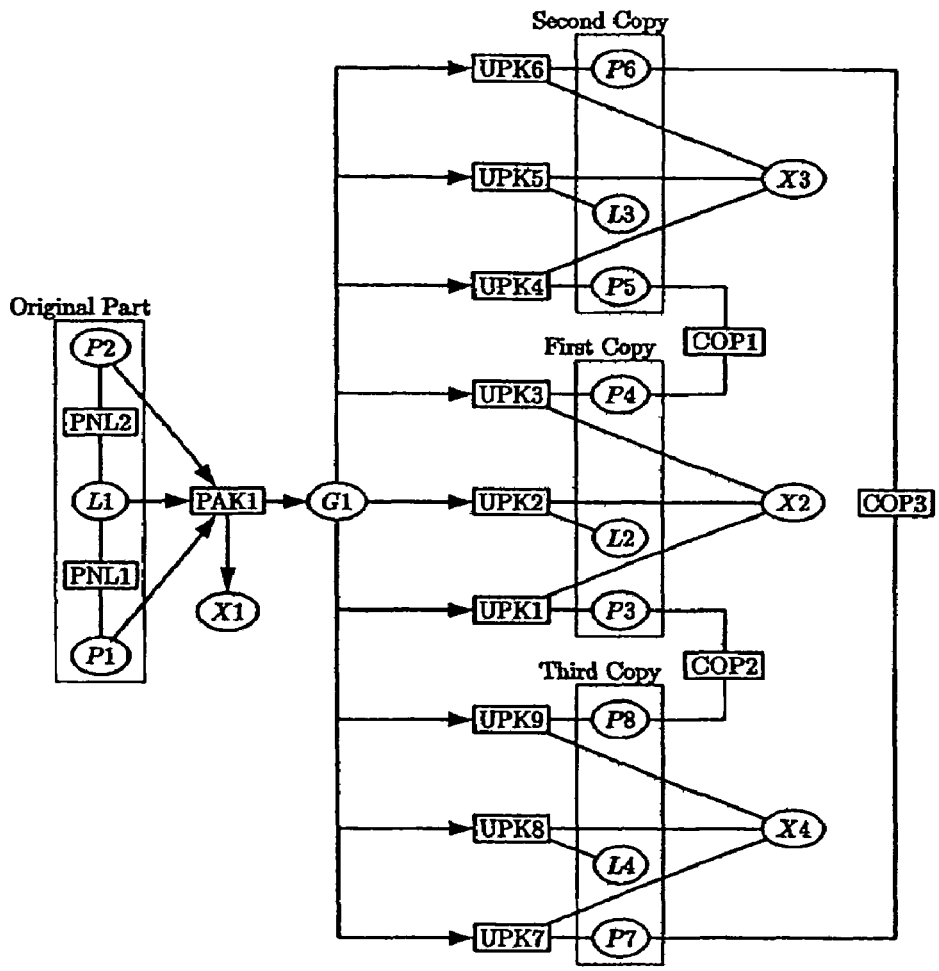
FIG. 11 is an example of a dependency graph with three copies that may be created using a conventional modeling system (UNPACK).

When the user asks for the other two copies of this part, the dependency graph looks like that in FIG. 11.

The user can now add the constraints that constrain these three copies of the part into one assembly. One possible set of coincident points constraints are shown in FIG. 11 as the three COP (coincident point) constraints.

6.3: Summary of PACK and UNPACK

Based on a study of FIG. 11, we can draw the following conclusions:

There are no intra-part constraints on the copies of the original part.

The inter-part constraints applied to the copies of the original part can only affect the rigid body transforms (the parameters X2, X3, and X4 in FIG. 11).

The copies of the part will behave as if they are fully constrained even if the original part is not.

If the original part is changed by merely moving and rotating it, that change will be absorbed by the transform associated with the PACK constraint. Such changes will have no impact on the geometry in the assembly.

The only way to change the geometry of the original part is to affect the constraints on the original geometry (P1-L1-P2 in FIG. 11). This technique for modeling assemblies cannot be used as a layout where the geometry of the original parts is partially determined by constraints between parts in the assembly.

A study of the permanently directed arcs in FIG. 11 shows that the solution sequence will be:

Solve for all the geometry in the original part.

Ask the PACK constraints to solve themselves, which will change the values of the transform parameter X1 and the gateway parameter G1.

Solve the constraints involving the rigid copies of the original part. This will involve solving the UNPACK constraints for the transform parameters.

Having described how such an assembly might be handled on a conventional system known as Mechanical Advantage, we next describe novel techniques in accordance with the invention

7: Assembly Transform Constraints

In accordance with one embodiment of the invention, instead of having a constraint between the original part and its gateway, then having many constraints between this gateway and the geometry of the copy of the part, an alternative formulation for an assembly constraint is to have a constraint directly between each item of geometry in the original part and its corresponding item in the copy.

7.1: First Copy of the Part

Figure 10:
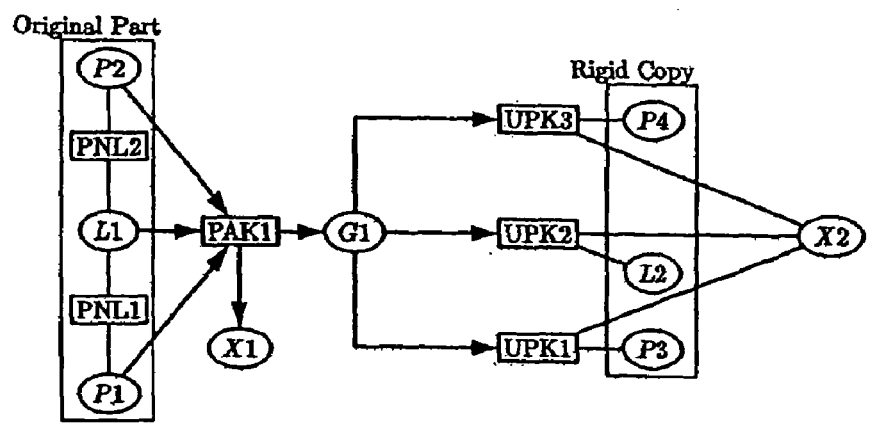
FIG. 10 is an example of a dependency graph that may be created using a conventional modeling system (UNPACK).
Figure 12:
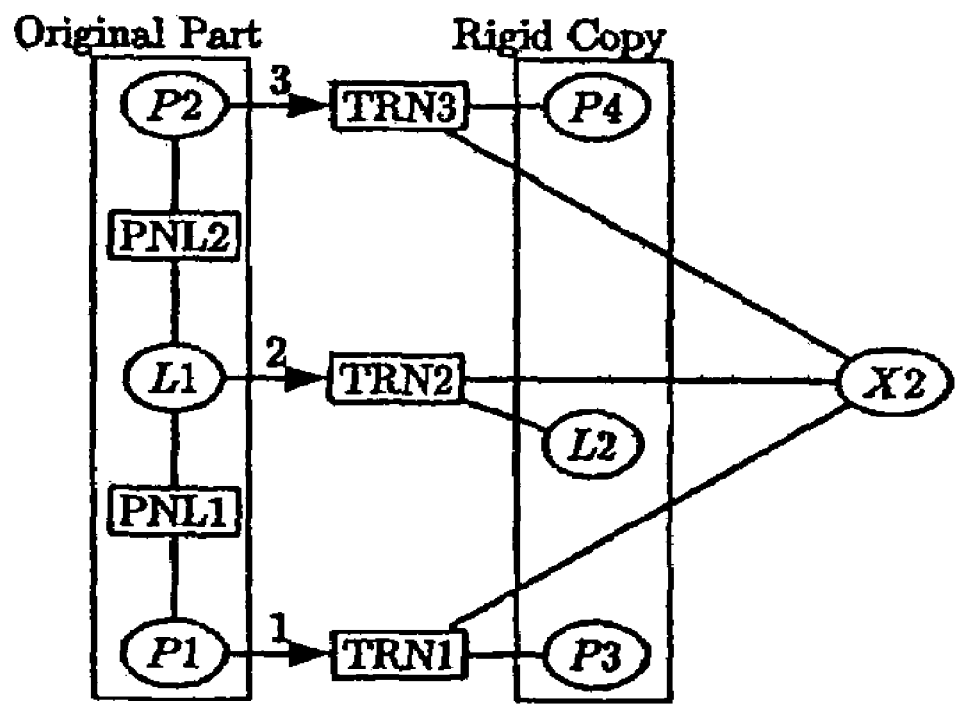
FIG. 12 is an assembly dependency graph in accordance with the present invention.

After the user has created one rigid copy of the part in FIG. 10, the corresponding dependency graph will look like that in FIG. 12.

The three edges (arcs) labeled 1, 2, and 3 deserve special attention. If these edges are marked as permanently directed toward the unpack constraints, as shown in FIG. 12, then this model will behave almost the same way as the PACK/UNPACK system described above:

There are no intra-part constraints on the copies of the original part.

The inter-part constraints applied to the copies of the original part can only affect the rigid body transforms (the parameters X2, X3, and X4 in FIG. 12).

The copies of the part will behave as if they are fully constrained even if the original part is not.

If the original part is changed by merely moving and rotating it, that change may affect the geometry of the assembly. If the original parts change only by a rigid body transformation and the assembly is fully constrained, then the solution process will change all the transform parameters but leave all the geometry in the assembly unchanged. But if the assembly is underconstrained, then the geometric parameters of the assembly will get involved in the solution process and may have their values changed. To the user, a rotation of an original part will cause the assembly to move and perhaps change shape.

The only way to change the geometry of the original part is to affect the constraints on the original geometry (P1-L1-P2 in FIG. 12). This technique for modeling assemblies cannot be used as a layout where the geometry of the original parts is partially determined by constraints between parts in the assembly.

7.2: With Interpart Constraints

Figure 13:
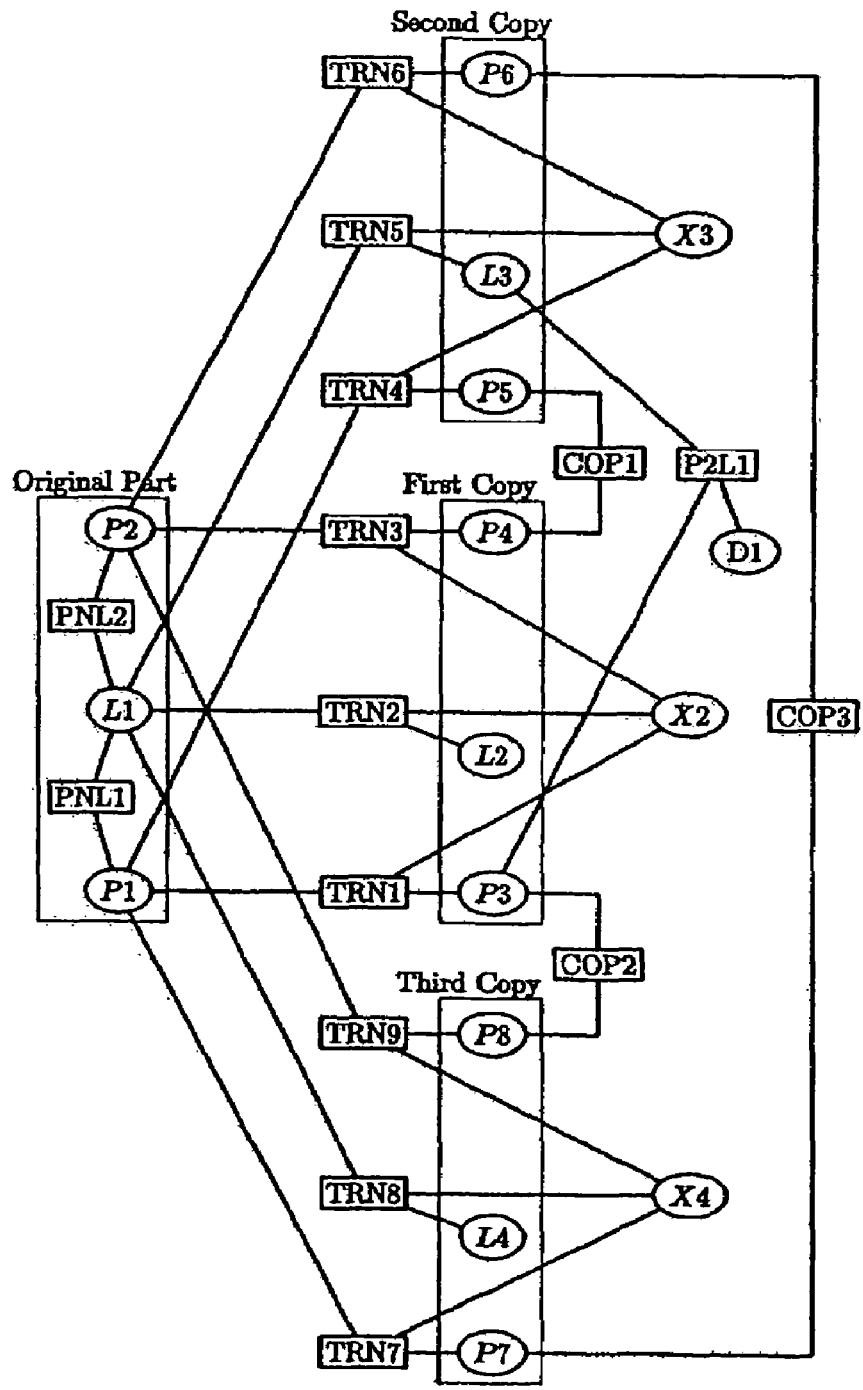
FIG. 13 is a three-part assembly dependency graph in accordance with the present invention.

After the user has created two other copies of this part, added the three interpart coincident constraints, and added a point to line dimension between a point on one part and a line in another part, the dependency graph looks like that in FIG. 13. The "special attention" arcs (the edges in FIG. 12 labeled 1, 2 and 3 and shown as being directed) are not shown as being directed in FIG. 13.

Without the point-to-line dimension P2L1, this dependency graph could behave very similar to that of FIG. 11. All of the arcs from P1, L1, and P2 to TRN constraints could be directed toward the TRN constraints, making the three copies into rigid bodies that have only the rigid transform degrees of freedom.

But the point-to-line dimension P2L1 cannot drive the dependent copies of the geometry without changing the distance between the points P1 and P2, i.e. without deforming the original part. At least one of the arcs from the geometry of the original part to the TRN constraints cannot be directed toward the TRN constraint in order for the dimension P2L1 to drive geometry. Accordingly, in order for the P2L1 dimension to drive the dependent copies of the geometry, at least one of the arcs from the original part to the TRN constraint must be reversed so that it is directed from the TRN constraint to the original geometry.

7.3: "Lazy" Constraint Creation

If the constraints on copies of parts as described previously are implemented, then only some of these transform constraints will be present. In other words, the constraints will only get added as they are needed.

Figure 14:
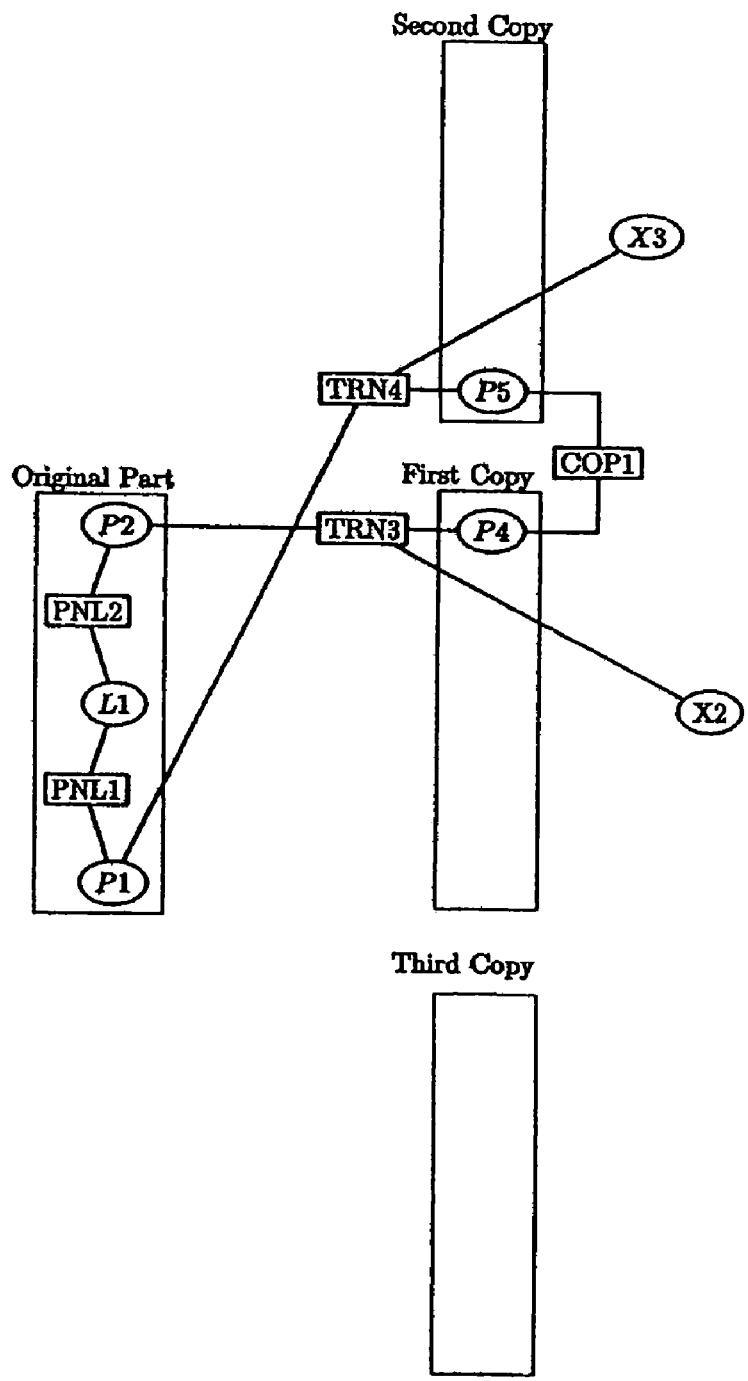
FIG. 14 is a three-part assembly dependency graph in accordance with the present invention showing a first COP constraint.
Figure 15:
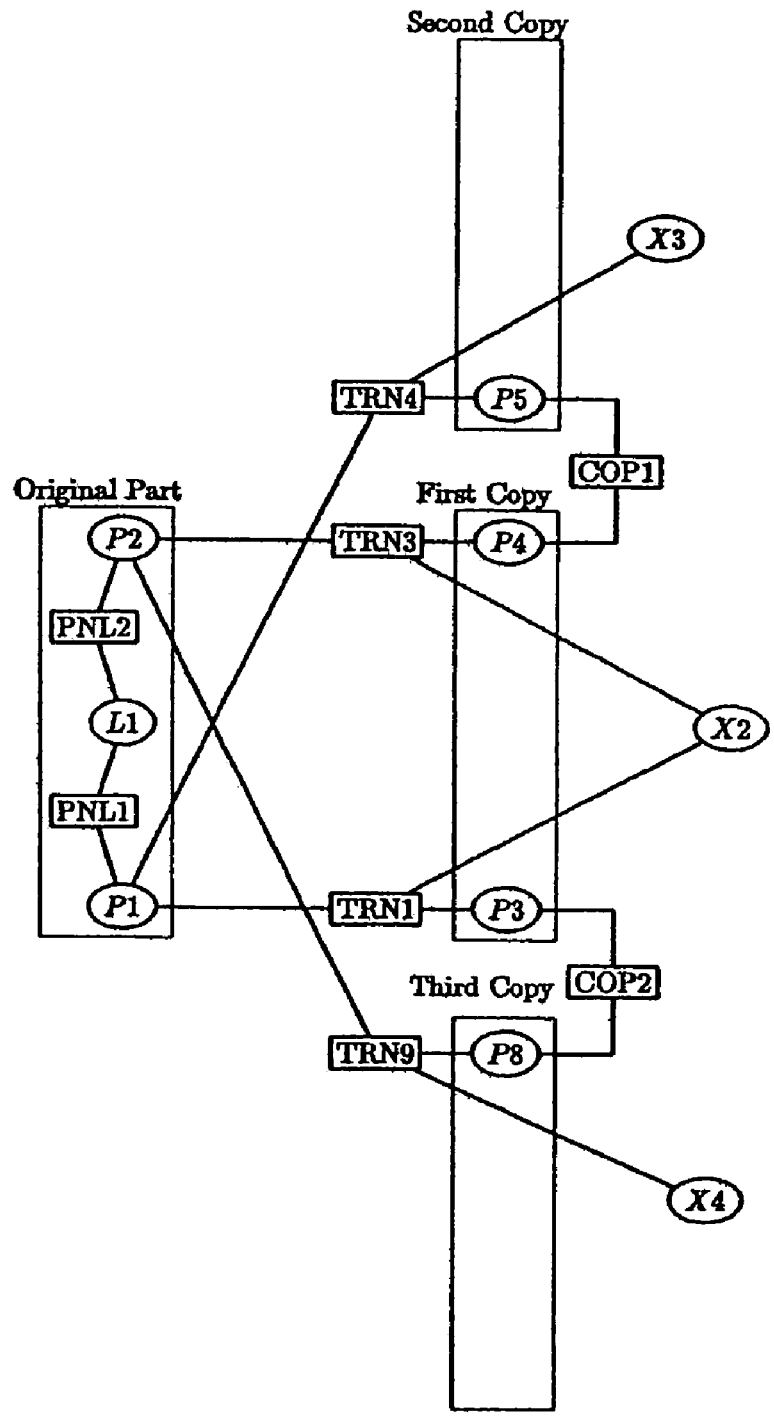
FIG. 15 is a three-part assembly dependency graph in accordance with the present invention showing a second COP constraint.
Figure 16:
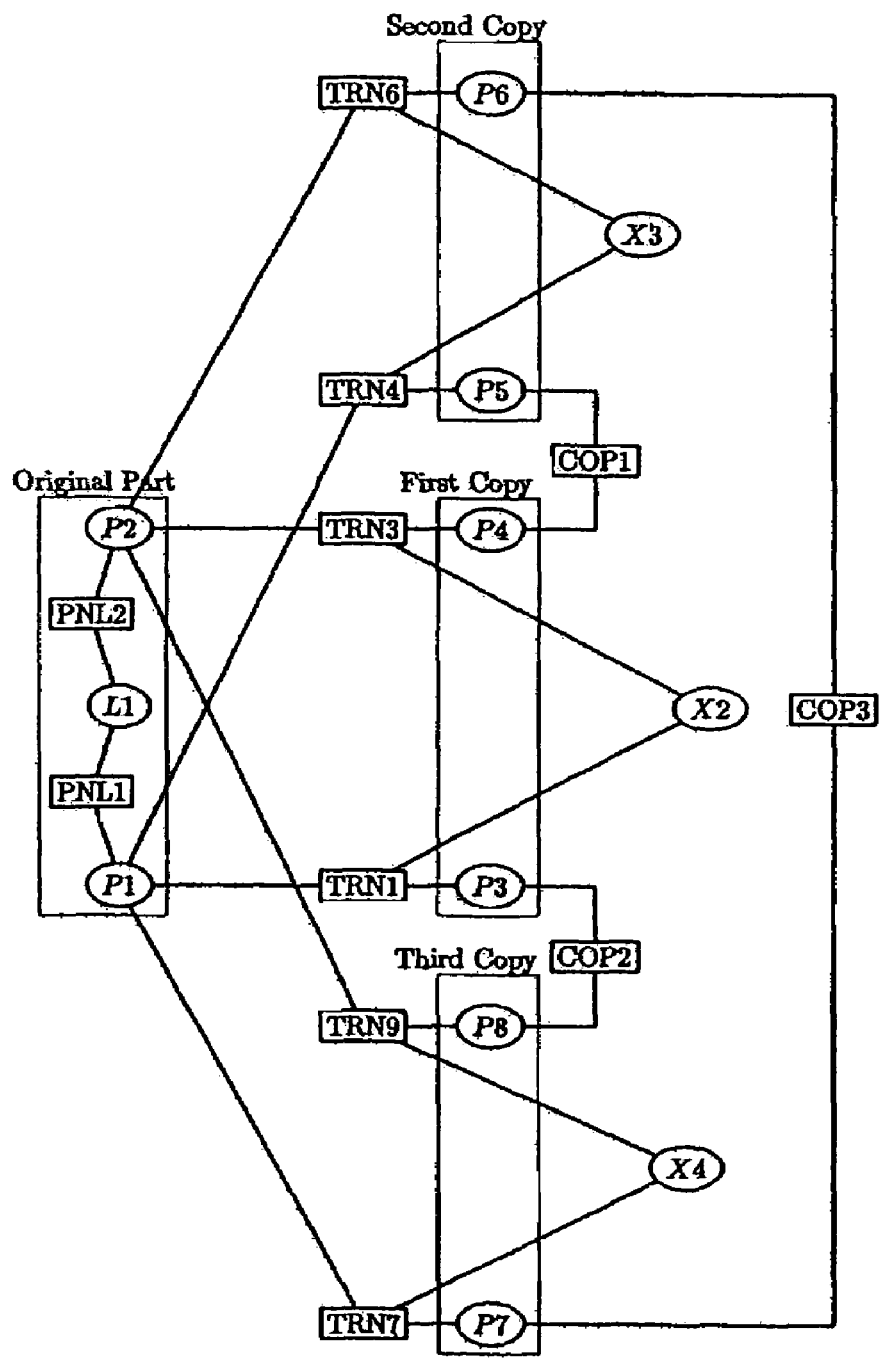
FIG. 16 is a three-part assembly dependency graph in accordance with the present invention showing a third COP constraint.
Figure 17:
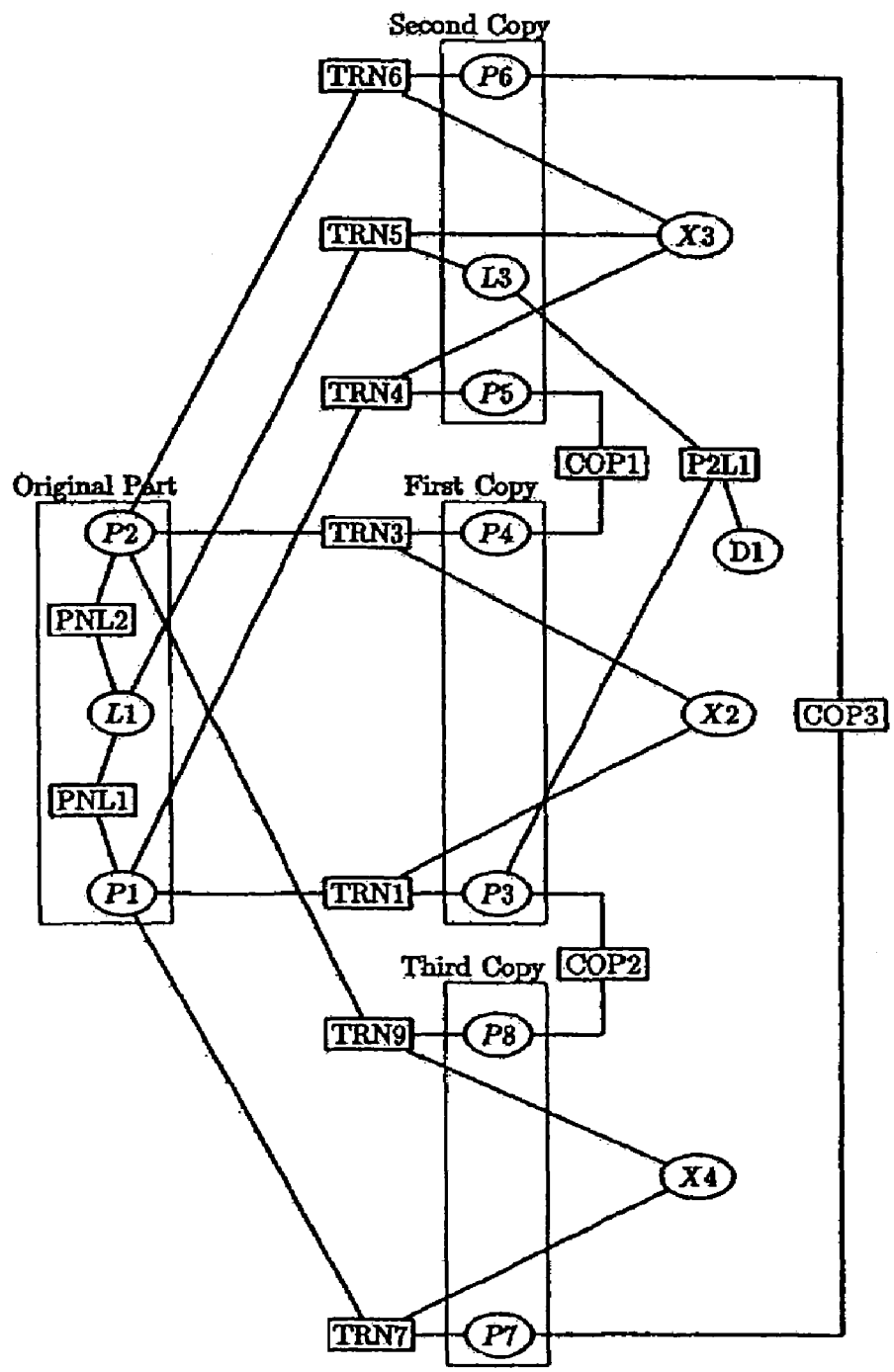
FIG. 17 is a three-part assembly dependency graph in accordance with the present invention after adding a dimension (D1).

For the situation shown in FIG. 13, the part copy parameters and transform constraints would get added as follows:

The parameters P4 and P5, the transforms X2 and X3, and the constraints TRN3 and TRN4 would get added when the user added the COP1 constraint. This dependency graph is shown in FIG. 14;

The parameters P3 and P8, the transform X4 (X3 already exists), and the constraints TRN1 and TRN9 would get added when the user added the COP2 constraint. This dependency graph is shown in FIG. 15;

The parameters P6 and P7 (the transforms X3 and X4 already exist) and the constraints TRN6 and TRN7 would get added when the user added the COP3 constraint. This dependency graph is shown in FIG. 16;

The parameter L3 and the constraint TRN5 (the transform X3 already exists) would be added at the time the user added the D1 dimension and its parameter P2L1. This dependency graph is shown in FIG. 17;

The parameters L4 and L2 along with the constraints TRN2 and TRN8, and all arcs connecting to these nodes would never get created and would be absent from the corresponding dependency graph(s).

7.4: Applying Directions to the Dependency Graph

Figure 18:
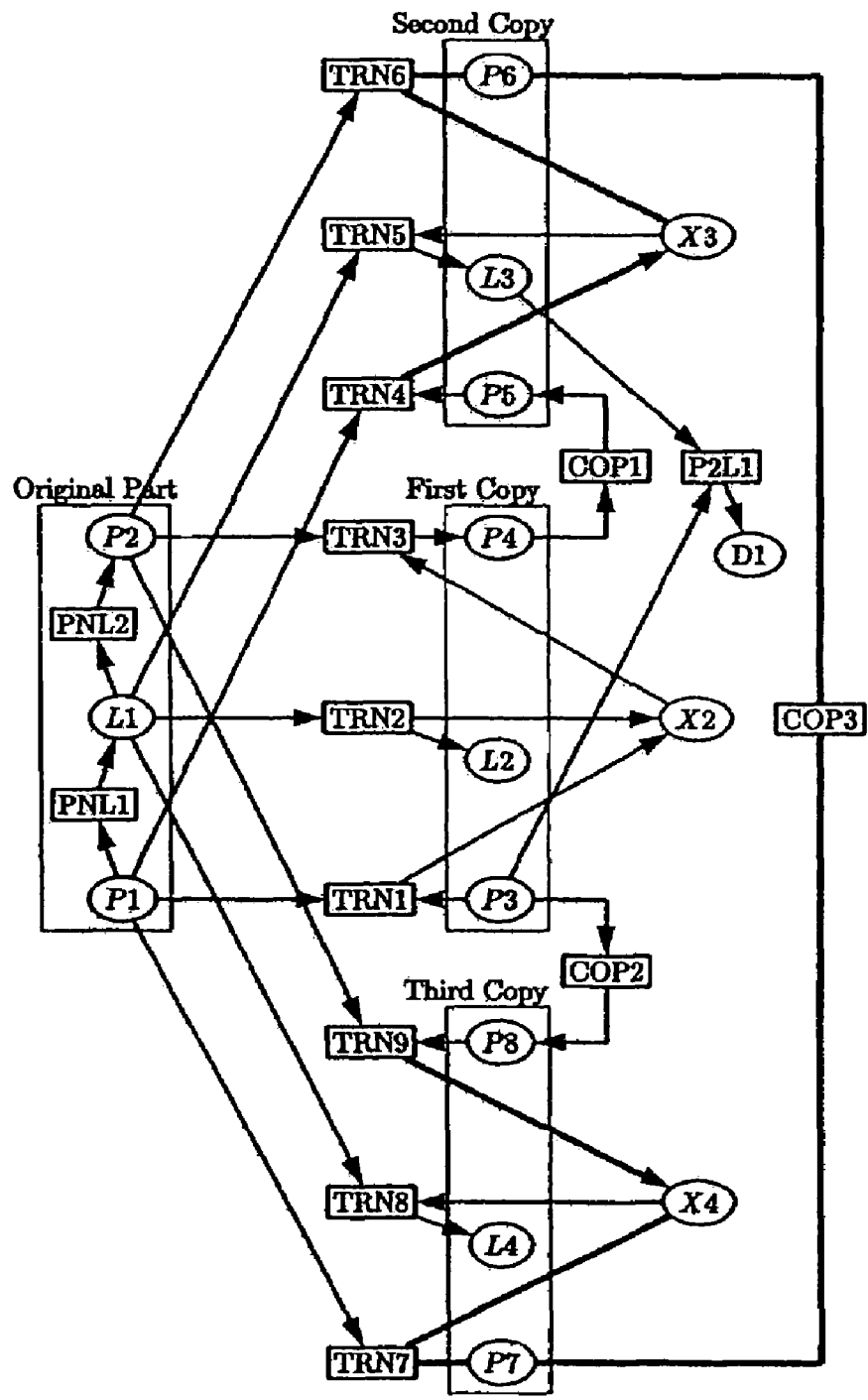
FIG. 18 is a three-part assembly directed graph in accordance with the present invention.

FIG. 18 is an illustration of applying directions to the arcs in the dependency graph of FIG. 13. For the purposes of this illustration, the start point is just before the user added the P2L1 dimension.

Some comments regarding assigning these directions:

It is assumed that all special arcs (those from geometry in the original part to TRN constraints), are initially all directed toward the TRN constraints. The addition of the P2 μl dimension may change the direction of one or more of these special arcs, and thereby support flexible dependents and/or layout. See also Section 7.5 (User Interface Constraints) below.

Not shown in FIG. 18 are various ground constraints. It is assumed that the user has grounded (fixed in place) the point P1 and P3 and has grounded (fixed the angle of) the lines, L1 and L2.

Each of the TRN constraints controls two degrees of freedom. Each TRN constraint should be treated as if it were two equations, each of which can be directed differently.

The two constraints TRN1 and TRN2, each controlling two degrees of freedom, are used to determine the three components of X2 and the one remaining component of L2. This is shown by making the arcs from these two constraints point at these two parameters.

The sequence TRN9-X4-TRN7-P7-COP3-P6-TRN6-X3-TRN4 forms a system of ten equations in the ten unknown components of the parameters. The system should collect these five constraints into one system of equations and use it to drive the four parameters. This system is shown by using a heavier line for the arcs.

Given this system of equations, then the transform parameter X3 drives the constraint TRN5 which then drives the line parameter L3.

Given this system of equations, then the transform parameter X4 drives the constraint TRN8 which then drives the line parameter L4.

At this point, the geometry has one remaining degree of freedom, the distance between the points P1 and P2.

7.5: User Interface Considerations

When the user selects some geometry and says to make it into a rigid part, this method can:

1. Create a copy of each parameter in the part, but translate it some distance so the rigid copy will not overlay the original part. This could be accomplished by having the user drag and drop the copy of the part, or by creating the part copy in a different filespace.
2. Connect each parameter in the part to its copy with a TRN constraint, all these TRN constraints using the same "X" transform parameter (e.g., X2, X3, and X4 as shown in FIG. 13). Note that the term "transform constraint" herein is used to refer to the TRN constraints in the drawings, while the term "transform parameters" is used to refer to the "X" parameters in the drawings.
3. "Permanently" direct all the arcs from the original parameter toward the TRN constraint. This makes each of the copied geometry items "Rigid."

When the user wants to lock a dimension that is driven by dependent copies of geometry and thereby backsolve from the dependent copies for the purposes of layout, or to make dependent copies non-rigid, this method can:

1. Perform a sensitivity analysis of that dimension where the only possible contributors are the rigid body transform constraints (the TRN constraints).

2. If any TRN constraints are significant contributors to that dimension value, the user is prompted if he wants to convert from "Rigid" to "Layout" any of the items of copied geometry associated with these TRN constraints.
3. If the answer is "yes," then the directionality of the selected arc is reversed to point away from its TRN constraint toward the original part geometry, the direction of the dimension is reversed, and the Dinic algorithm directionality calculations are repeated. (Dinic's algorithm is a known computer science algorithm used, for example, in prior art computer-aided modeling systems for various purposes, including assigning arc directions in a dependency graph.)

This is but one possible user interface consideration. It should be understood that many User Interface designs are possible to accomplish these objectives. For example, in order to make a dependent component non-rigid, rather than requiring a user to perform a sensitivity analysis and select TRN constraints that will be reversed, the user could be directed to select dimensional constraints on the master component, and the system may then traverse the dependency graph between the dimensional constraint on the master and the dependent copies that will be become non-rigid, and determine the appropriate TRN constraints that will be reversed.

CONCLUSION

The disclosed invention provides a system and methods that combine mathematical and geometric modeling in a manner that eliminates performance and convergence problems, and simplifies customer modeling. It also supports flexible dependent instances (non-rigid bodies) with inherent functional properties, thus providing users with the ability to model devices that deform and/or respond in some manner when assembled as dependent instances with other simulated parts.

Functions:

One aspect of the invention includes software that enables engineers to:

(1) Capture component-level functional information in "black box" modules.

(2) Collaboratively assemble black box models into system-level/enterprise models.

(3) Embed functional information into CAD models.

Underlying Principles:

(1) One practice of the invention combines mathematical modeling with geometric and empirical modeling to enable components and assemblies to compute their own Functional Properties.

(2) A further practice of the invention can include an "Analysis Bus" that enables interaction between $3^{rd}$ party analysis tools.

Examples of Functional Properties:

(1) Springs: Stiffness, Endurance Limit.

(2) Bearings: Load capacity, Life expectancy.

(3) Motors: Torque and speed ratings, efficiency.

(4) Pumps: Flow rate, energy consumption, pressure rating.

(5) Belts: Tension limits, stiffness, minimum wrap angle.

Other Aspects:

(1) Functional properties generally depend on geometric (shape) properties and other physical properties such as density, modulus of elasticity, and conductivity.

(2) As described below, it is useful to organize component properties into "Inputs" and "Outputs."

(3) Many functional properties depend on component interaction. For example, components exert forces on each other.

(4) The outputs of one component may be an input to other components, and the output of those components may feedback to the first component.

(5) The present invention enables components to compute their own functional properties based on geometric and physical properties (black box component modules), and to compute system-level properties based on interaction with other components in assemblies.

(6) One practice of the invention also provides a collaborative assembly framework that manages change and assimilation in a manner similar to the way software build tools such as CVS manage collaborative change and assimilation.

(7) Those skilled in the art will understand that engineering knowledge accumulates in component and assembly definitions during the course of normal engineering activities. Accumulated knowledge can be leveraged to subsequent redesigns, saving time and improving reliability.

(8) Common design tasks can be automated by building "methods" into core product definitions.

(9) Collaborative engineering is facilitated by defining functional "inputs" and "outputs" that may be used by other team members.

(10) System level modeling can be performed by "assembling" parts mathematically as well as geometrically (using the defined inputs and outputs).

(11) Cross discipline analysis is enabled because the output of one set of analyses can be directed to inputs of other analyses.

(12) Optimization, critical parameter identification, and latitude studies become much faster and significantly easier to implement.

(13) Engineers have immediate access to diverse information pertaining to components and assemblies.

(14) Engineering data becomes easier to manage.

Constraint Server:

(1) Substantially all modern CAD systems incorporate constraint servers for parametric modeling of geometry. However, the constraint servers used by prior art systems are specialized around geometry.

(2) The constraint server of the present invention differs markedly from constraint servers typical of the prior art, in that it is a general purpose, algebraic constraint server.

(3) It treats geometry simply as a set of equations to be solved along with any other
 (non-geometric) equations. As a result, models constructed using the invention seamlessly intermix math and geometry.

(4) It handles both non-directed (variational) and directed
 (parametric/logical/sequential) constraints.

(5) It can be implemented to employ sophisticated dependency management routines to maximize solving efficiency, and to enable rapid solution of very large equation matrices.

(6) It can also be implemented to support both component-level and collaborative assembly-level modeling.

It is to be understood that the invention described herein is amenable to a wide range of variations, modifications and alternative constructions and implementations. It should therefore also be understood that there is no intention to limit the invention to the specific implementations described herein. On the contrary, the invention is intended to cover all modifications, alternative implementations and equivalents falling within the scope and spirit of the invention as defined by the claims appended below.

We claim:

1. In a computer aided design system, a computer-implemented method comprising:
    providing a variational constraint server in the computer aided design system that supports combined mathematical and geometric modeling, and wherein
    the variational constraint server is operable to
    (1) accept user input to create a master component,
    (2) provide a dependent copy of the master component in an assembly design,
    (3) solve, by a computer system operating the variational constraint server, user-entered equations to compute functional properties of the dependent copy based on (1) geometric properties and non-geometric parameters in the assembly design and (2) geometric properties of the master component, and
    (4) constrain geometric properties of the dependent copy and the master component based on the computed functional properties the master component being updated by user-defined functional relationships applied to the dependent copy.

2. A computer aided design system comprising;
    a computer configured to operate a variational constraint server that supports combined mathematical and geometric modeling, and wherein
    the variational constrain server is operable to
    (1) accept user input to create a master component,
    (2) provide a dependent copy of the master component in an assembly design,
    (3) solve user-entered equations to compute functional properties of the dependent copy based on (1) geometric properties and non-geometric parameters in the assembly design and (2) geometric properties of the master component, and
    (4) constrain geometric properties of the dependent copy and the master component based on the computed functional properties, the master component being updated by user-defined functional relationships applied to The dependent copy.

3. The system of claim 2 wherein the constraining of geometric properties comprises maintaining a transform constraint directly between each geometric property in the master component and a corresponding property in the dependent copy of the master component.

4. The method of claim 1 wherein the constraining geometric properties comprises maintaining a transform constraint directly between each geometric property in the master component and a corresponding property in the dependent copy of the master component.

5. In a computer aided design system, a method of configuring 4 variational constraint server, the method comprising:
    accepting user input to the computer aided design system to create a master component;
    providing a dependent copy of the master component in an assembly design;
    solving, by a computer system operating the variational constraint server, a user-entered equation to compute functional properties of The dependent copy based on (1) geometric properties and non-geometric parameters in the assembly design and (2) geometric properties of the master component; and
    configuring a variational constraint server to constrain, based on the computed functional properties, geometric properties or values of the dependent copy and the master component by a user-defined functional relationship applied to the dependent copy, the constraining comprising maintaining a constraint relationship directly between each geometric property or value in the master component and a corresponding property or value in the dependent copy, the master component being updated based on the constraint relationship with the dependent copy.

6. In a computer aided design system, an apparatus comprising:
    a storage device storing instructions that, when executed by a computer system cause the computer system to:
    provide a master component having a set of geometric and functional properties;
    produce a dependent copy of the master component in an assembly design, the dependent copy based on the master component and the set of geometric and functional properties;
    calculate modification to the dependent copy to satisfy criteria regarding 1) the set of geometric and functional properties of the master component and 2) a constraint on the dependent copy imposed by the assembly; and
    update the dependent copy and the master component based on the calculated modification, the master component being updated based on a transform constraint between the master component and dependent copy.

7. The apparatus of claim 6, further comprising instructions to maintain a transform constraint between each geometric pan in the master component and a corresponding geometric pant in the dependent copy.

8. The apparatus of claim 6, further comprising instructions to:
    provide a second dependent copy of the master component in the assembly design, the second dependent copy based on the master component and the set of geometric and functional properties, and wherein the calculating modification to the dependent copy is based on a state of the second dependent copy imposed by the assembly design.

9. The apparatus of claim 6, wherein the update includes configuring the dependent copy to have a geometric or functional property that is distinct from the set of properties.

10. The apparatus of claim 6, wherein the calculating modification includes variationally solving a system of interdependent equations including values corresponding to the user-entered parameter and the set of geometric and functional properties.

11. The apparatus of claim 6, wherein the set of geometric and functional properties includes a dimension.

12. The apparatus of claim 11, wherein the set of geometric and functional properties includes a functional property that is dependent on the dimension.

13. The apparatus of claim 6, wherein calculating the modification includes calculating modification to satisfy criteria regarding a user-entered parameter.

* * * * *

UNITED STATES PATENT AND TRADEMARK OFFICE
CERTIFICATE OF CORRECTION

PATENT NO.         : 7,623,139 B1                      Page 1 of 1
APPLICATION NO.    : 10/959896
DATED              : November 24, 2009
INVENTOR(S)        : Ralph Gifford et al.

It is certified that error appears in the above-identified patent and that said Letters Patent is hereby corrected as shown below:

In Claim 2, line 50, delete "The" and insert --the--;

In Claim 4, line 57, after "constraining" insert --of--;

In Claim 5, line 5, delete "The" and insert --the--;

In Claim 5, line 63, delete "4" and insert --a--;

In Claim 7, line 37, delete "pan" and insert --part--;

In Claim 7, line 38, delete "pant" and insert --part--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,623,139 B1  Page 1 of 1
APPLICATION NO. : 10/959896
DATED : November 24, 2009
INVENTOR(S) : Ralph Gifford et al.

It is certified that error appears in the above-identified patent and that said Letters Patent is hereby corrected as shown below:

Column 17, In Claim 2, line 50, delete "The" and insert --the--;

Column 17, In Claim 4, line 57, after "constraining" insert --of--;

Column 17, In Claim 5, line 63, delete "4" and insert --a--;

Column 18, In Claim 5, line 5, delete "The" and insert --the--;

Column 18, In Claim 7, line 37, delete "pan" and insert --part--;

Column 18, In Claim 7, line 38, delete "pant" and insert --part--.

This certificate supersedes the Certificate of Correction issued February 9, 2010.

Signed and Sealed this

Ninth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,623,139 B1
APPLICATION NO. : 10/959896
DATED : November 24, 2009
INVENTOR(S) : Gifford et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 699 days.

Signed and Sealed this

Twenty-sixth Day of October, 2010

David J. Kappos
*Director of the United States Patent and Trademark Office*